US009582704B2

(12) United States Patent
Jägemalm et al.

(10) Patent No.: US 9,582,704 B2
(45) Date of Patent: Feb. 28, 2017

(54) CONNECTION PADS FOR A FINGERPRINT SENSING DEVICE

(71) Applicant: Fingerprint Cards AB, Göteborg (SE)

(72) Inventors: Pontus Jägemalm, Lerum (SE); Karl Lundahl, Göteborg (SE); Mats Slottner, Lerum (SE); Hans Thörnblom, Kungsbacka (SE); Ojie Julian, Sta Rosa (PH)

(73) Assignee: FINGERPRINT CARDS AB, Göteborg (SE)

( * ) Notice: Subject to any disclaimer, the term of this patent is extended or adjusted under 35 U.S.C. 154(b) by 0 days.

(21) Appl. No.: 14/911,573

(22) PCT Filed: Aug. 22, 2014

(86) PCT No.: PCT/SE2014/050962
§ 371 (c)(1),
(2) Date: Feb. 11, 2016

(87) PCT Pub. No.: WO2015/026288
PCT Pub. Date: Feb. 26, 2015

(65) Prior Publication Data
US 2016/0210495 A1    Jul. 21, 2016

(30) Foreign Application Priority Data
Aug. 23, 2013    (EP) .................................... 13181514

(51) Int. Cl.
*G06K 9/00* (2006.01)
*H01L 23/00* (2006.01)
(52) U.S. Cl.
CPC ............. *G06K 9/0002* (2013.01); *H01L 24/03* (2013.01); *H01L 24/05* (2013.01); *H01L 24/09* (2013.01);
(Continued)

(58) Field of Classification Search
CPC .................. G06K 9/0002; H01L 24/02–24/09; H01L 24/42–24/49; H01L 2224/033; H01L 2224/48148
See application file for complete search history.

(56) References Cited

U.S. PATENT DOCUMENTS 5,778,089 A * 7/1998 Borza .................. G06K 9/0002
250/556
6,333,989 B1 12/2001 Borza
(Continued)

FOREIGN PATENT DOCUMENTS

JP    2001120519 A    5/2001

OTHER PUBLICATIONS

Basrour, S. et al., "A Sweeping Mode Integrated Fingerprint Sensor With 256 Tactile Microbeams", Journal of Microelectromechanical Systems, 20040801, IEEE Service Center, US, ISSN 1057-7157, vol. 13, No. 4, Aug. 2004, pp. 636-644.
(Continued)

*Primary Examiner* — Aaron W Carter
(74) *Attorney, Agent, or Firm* — Remarck Law Group PLC

(57) ABSTRACT

A fingerprint sensing device comprising sensing circuitry comprising a plurality of sensing elements, each sensing element comprising a sensing structure arranged in a sensing plane and facing a surface of the capacitive fingerprint sensing device, each of the sensing elements being configured to provide a signal indicative of an electromagnetic coupling between the sensing structure and a finger placed on the surface of the fingerprint sensing device; and a plurality of connection pads electrically connected to the sensing circuitry for providing an electrical connection between the sensing circuitry and readout circuitry, wherein each of the connection pads is separately recessed in relation to the sensing plane such that each connection pad has a
(Continued)

floor in a floor plane, and wherein each connection pad is separated from an adjacent connection pad through a portion of the sensing device being elevated in relation to the floor plane.

20 Claims, 8 Drawing Sheets

(52) U.S. Cl.
CPC ............... *H01L 24/48* (2013.01); *H01L 24/49* (2013.01); *H01L 2224/033* (2013.01); *H01L 2224/035* (2013.01); *H01L 2224/0345* (2013.01); *H01L 2224/03462* (2013.01); *H01L 2224/04042* (2013.01); *H01L 2224/05022* (2013.01); *H01L 2224/05624* (2013.01); *H01L 2224/05647* (2013.01); *H01L 2224/06179* (2013.01); *H01L 2224/48091* (2013.01); *H01L 2224/48148* (2013.01); *H01L 2224/48465* (2013.01); *H01L 2224/48471* (2013.01); *H01L 2224/49175* (2013.01); *H01L 2224/85186* (2013.01); *H01L 2924/00014* (2013.01); *H01L 2924/10155* (2013.01); *H01L 2924/10157* (2013.01); *H01L 2924/181* (2013.01)

(56) References Cited

U.S. PATENT DOCUMENTS

| | | | |
|---|---|---|---|
| 8,981,578 B2 | 3/2015 | Last et al. | |
| 9,018,091 B2 | 4/2015 | Arnold et al. | |
| 9,190,379 B2 | 11/2015 | Arnold et al. | |
| 9,425,134 B2* | 8/2016 | Ho | H01L 23/49805 |
| 2003/0224553 A1 | 12/2003 | Manansala | |
| 2004/0159961 A1 | 8/2004 | Mensch et al. | |
| 2011/0309482 A1* | 12/2011 | Salatino | G06K 9/00053 257/659 |
| 2012/0104606 A1* | 5/2012 | Okuda | H01L 21/565 257/738 |
| 2014/0140588 A1 | 5/2014 | Chou | |
| 2014/0264839 A1* | 9/2014 | Tsai | H01L 23/49816 257/737 |
| 2014/0328523 A1* | 11/2014 | Lin | H01L 21/561 382/124 |
| 2014/0369573 A1* | 12/2014 | Chiu | G06K 9/00013 382/124 |
| 2016/0171271 A1* | 6/2016 | Lundahl | G06K 9/0002 382/124 |
| 2016/0210495 A1* | 7/2016 | Jagemalm | G06K 9/0002 |
| 2016/0210496 A1* | 7/2016 | Lin | G06K 9/00053 |
| 2016/0211233 A1* | 7/2016 | Yiu | H01L 24/02 |

OTHER PUBLICATIONS

PCT International Search Report and Written Opinion for International Application No. PCT/SE2014/050962 mailed Dec. 5, 2014, 11 pages.

Rosa, M.A. et al., "Flip-Chip Process Development Using Recessed Bonding Pads for Laser/MEMS Integration," Part of the SPIE Conference on Electronics and Structures for MEMS, Royal Pines Resort, Queensland, Australia, Oct. 1999, vol. 3891, ISSN 0277-786X, pp. 416-426.

\* cited by examiner

US 9,582,704 B2

CONNECTION PADS FOR A FINGERPRINT SENSING DEVICE

CROSS-REFERENCE TO RELATED APPLICATIONS

This application is a 371 U.S. National Stage of International Application No. PCT/SE2014/050962, filed Aug. 22, 2014, which claims priority to EP Application No. 13181514.4, filed on Aug. 23, 2013. The disclosure of each of the above applications is incorporated herein by reference in their entirety.

FIELD OF THE INVENTION

The present invention relates to a sensing device. More particularly, the present invention relates to a device for sensing fingerprints.

TECHNICAL BACKGROUND

As the development of biometric devices for identity verification, and in particular of fingerprint sensing devices, has lead to devices which are made smaller, cheaper and more energy efficient, the possible applications for such devices are increasing.

In particular fingerprint sensing has been adopted more and more in, for example, consumer electronic devices, due to small form factor, relatively beneficial cost/performance factor and high user acceptance (in particular in comparison to retina scanning etc).

Capacitive fingerprint sensing devices, built based on CMOS technology for providing the fingerprint sensing elements and auxiliary logic circuitry, are increasingly popular as such sensing devices can be made both small and energy efficient while being able to identify a fingerprint with high accuracy. Thereby, capacitive fingerprint sensors are advantageously used for consumer electronics, such as portable computers, tablets and mobile phones.

A fingerprint sensing chip typically comprises an array of capacitive sensing elements providing a measure indicative of the capacitance between several sensing structures and a finger placed on the surface of the fingerprint sensor. The sensing chip may further comprise logic circuitry for handling addressing of the array of sensing elements.

Furthermore, the sensing chip is often mounted on a separate readout substrate comprising readout circuitry, wherein contact pads of the sensing chip are provided for enabling an electrical connection via means of wire-bonding to corresponding contact pads of the readout substrate. The readout substrate may for example be a printed circuit board (PCB).

However, a wire bond protrudes above the surface of the sensing chip with a distance corresponding to the height of the bond plus the curvature of the bond-wire, commonly referred to as the wire bond loop height.

Accordingly, protruding wire bonds introduce constraints in the assembly and design of a fingerprint sensor. In particular, in many applications is it desirable to provide a fingerprint sensing device which is flat, both for aesthetic reasons and as elevated portions of a sensing surface may lead to that a finger is partially lifted near the protruding portion. In addition, any protruding portions of an electrically conductive feature, relative to the pixels, such as e.g. a wire bond, will inevitably deteriorate the ability of the device to resist electrostatic discharges (ESD).

In order to achieve a flat sensing surface, it is possible to provide a layer of top coating which is sufficiently thick so that the protruding wire bond is covered, thereby forming a flat outer surface. However, a thicker coating result in a weaker capacitive coupling between a finger placed on the surface and a sensing element located under the coating, which leads to a reduced accuracy of the sensing device.

US2011/0254108 discloses a fingerprint sensing device where the aforementioned problem is addressed by providing a protective plate having dielectric properties enhancing the capacitive coupling between a finger on the surface of the plate and a sensing element located underneath the protective plate.

Even so, it is desirable to be able to provide a top layer of a fingerprint sensing device having a thickness which is determined by the desired capacitive coupling properties of the sensing device, and not by the geometry of the electrical connection between a sensing chip and a substrate.

SUMMARY OF THE INVENTION

In view of the above-mentioned desired properties of a fingerprint sensing device, and the above-mentioned and other drawbacks of the prior art, it is an object of the present invention to provide an improved fingerprint sensing device, and a method for manufacturing such a device.

According to a first aspect of the present invention, it is therefore provided a fingerprint sensing device comprising: sensing circuitry comprising a plurality of sensing elements, each sensing element comprising a sensing structure arranged in a sensing plane and facing a surface of the capacitive fingerprint sensing device, each of the sensing elements being configured to provide a signal indicative of an electromagnetic coupling between the sensing structure and a finger placed on the surface of the fingerprint sensing device; and a plurality of connection pads electrically connected to the sensing circuitry for providing an electrical connection between the sensing circuitry and readout circuitry, wherein each of the connection pads is separately recessed in relation to the sensing plane such that each connection pad has a floor in a floor plane, and wherein each connection pad is separated from an adjacent connection pad through a portion of the sensing device being elevated in relation to the floor plane.

A connection pad is required on the fingerprint sensing device for enabling an electrical connection between sensing circuitry comprised in the fingerprint sensing device and an external readout circuitry. The external readout circuitry may for example be arranged on a printed circuit board or a separate chip on which the fingerprint sensing device is mounted. It should furthermore be understood that the connection pad comprises an electrically conductive material for forming the electrical connection to the sensing circuitry of the fingerprint sensing device.

The floor plane of the connection pad should in the present context be understood as a plane in which a majority of the floor level of the recess is located. The recess is defined by the portions of the sensing device which are elevated in relation to the floor plane so that a connection pad is formed in said recess, separated from an adjacent recess. Moreover, the elevated portion of the sensing device may be seen as a wall or barrier separating adjacent connection pads.

The sensing circuitry typically comprises logic gates configured to address and read each sensing element.

The present invention is based on the realization that a fingerprint sensing device where a wire bond can be prevented from protruding above the sensing surface of a sensing device may be achieved by providing connection pads which are recessed in relation to the sensing elements. By making the distance from the sensing elements to the floor plane of the connection pads equal or larger than the wire bond loop height, a fingerprint sensing device can be provided where no electrically conductive parts of the sensing device protrude above the sensing surface. Such a device structure will enable the realization of a flat fingerprint sensor product without the aforementioned compromises in biometric performance and ESD immunity of the device.

The sensing device according to embodiments of the invention also enables the thickness of the die in which the sensing device is formed to be relatively thick compared to when using other interconnect technologies known by those skilled in the art such as e.g. through silicon vias (TSV). Yet another advantage invention is that interconnect leads may be created by means of wire bonding which is a well established and mature technology, paving the way for cost effective production in high volumes.

According to one embodiment of the invention, each of the plurality of connection pads is arranged at an edge of the fingerprint sensing device such that each connection pad is defined by a recess having a floor reaching the edge of the sensing device. By arranging the connection pad at the edge of the sensing device, wire bonds may be formed directly from the sensing device to form an electrical connection to circuitry on a readout substrate on which the fingerprint sensing device is arranged.

In one embodiment of the invention, the recess may have at least one sidewall reaching from said floor to a connection plane of said fingerprint sensing device, and wherein a conductive layer is arranged on at least a portion of said floor and said sidewall such that an electrical connection is formed between said floor and said sensing circuitry via said connection plane.

The electrical connection between the connection pads and the sensing circuitry may be achieved in different ways. For example, the sensing circuitry may have connection points which are arranged in the floor plane of the connection pad, or they may be arranged in a connection plane different from the floor plane. In applications where the connection plane is arranged in a plane different from the floor plane of the connection pad, the electrical connection may advantageously be formed by providing an electrically conductive layer reaching from the floor of the connection pad, along a sidewall and to the connection plane of the sensing circuitry. Thereby, the electrical connection between the connection pad and the sensing circuitry may be formed in one and the same manufacturing step of depositing a conductive material.

However, the sensing circuitry may also be connected to the connection pad using via connections used to connect different layers of conductive material separated by an insulating material. For example, an electrically conductive material may be formed which reaches from the floor of the connection pad, via a sidewall of the recess, to a plane of the sensing device which in turn is connected to the connection plane through a via connection. Furthermore, the conductive material in the recess may be deposited in a step separate from the deposition of the conductive material which forms the sensing element.

According to one embodiment of the invention, the connection plane may be arranged as an integral part of the topmost metal layer of the fingerprint sensing device. Thereby, the conductive portions of the connection plane and the conductive material of the connection pad may be formed in the in the same process step which reduces the number of processing steps required in the manufacturing process compared to if the connection plane and connection pads are made in different steps, and which also provides a more reliable electrical connection between the connection pad and the sensing circuitry.

Furthermore, the connection plane may advantageously be arranged in the sensing plane, meaning that the deposition of the connection plane coincides with the deposition of the sensing elements. Thereby, a more efficient manufacturing process can be achieved as several different features are formed in the same processing step.

In one embodiment of the invention, the sidewall may advantageously be sloped from said floor to said connection plane. A slope should in the present context be understood as an inclination, a sloped sidewall thereby being distinctly different from a vertical sidewall being perpendicular to the sensing plane. By using a sloped sidewall, the deposition of a conductive material reaching from the floor of the connection pad to an elevated portion of the sensing device may be simplified. For example, different deposition methods provide different degrees of step coverage and by providing a sloped sidewall, a wider range of different deposition methods and parameters may be used.

Furthermore, the sloped sidewall may advantageously have a slope higher than 45°, and preferably higher than 80°. Even though it may be advantageous to have a sloped sidewall from a manufacturability aspect, it is desirable to use a relatively steep slope angle as a slope having a more shallow angle takes up a larger surface area. Accordingly, as it is desirable to reduce the footprint area of the connection pad to increase the wafer area utilization, it is advantageous to use a sidewall having a slope in the abovementioned range. The slope of the sidewall is defined as the angle in relation to the floor plane, where a sidewall extending perpendicularly from the floor plane can be referred to as having a slope of 90°.

According to one embodiment of the invention, the conductive layer may further be arranged on a portion of an essentially planar surface surrounding at least a portion of each of the recessed connection pads. This is particularly advantageous when the conductive layer is formed in the same manufacturing step as connection point in the connection plane and/or sensing elements of the sensing device. By forming the conductive layer of the connection pad on at least a portion of a planar surface adjacent to the connection pad, a higher definition of features is allowed in a photolithographic process as the focus depth can be set based on the planar surface. Thus, the depth of the connection pads does not have to be taken into account when exposing the photolithographic resist mask used for subsequent patterning of the conductive layer.

In one embodiment of the invention, a depth of the recess may advantageously be larger than the wire bond loop height, typically more than 50 μm, more preferably larger than 75 μm, and most preferably larger than 100 μm. As the sensing device typically is formed in a semiconductor substrate which is several hundreds of micrometers thick, the recess may be made sufficiently deep so that any readily available wire bonding geometry and process may be used.

According to one embodiment of the invention, the fingerprint sensing device may advantageously be arranged on a readout substrate comprising readout circuitry, and wherein at least one of the plurality of connection pads is wire bonded to the readout circuitry. Furthermore, the connection pads and the wire bonds are advantageously configured so that the wire bond does not extend above the sensing plane.

According to one embodiment of the invention, each of the sensing elements may advantageously be configured to provide a signal indicative of a capacitive coupling between the sensing structure and a finger placed on the surface of the capacitive fingerprint sensing device. In a capacitive fingerprint sensing device, the capacitive coupling between the finger and capacitive sensing element enables detection of the fingerprint as a ridge of the fingerprint provides a better capacitive coupling than a valley of the fingerprint. A fingerprint sensing device may also be formed using RF coupling between sensing elements and the finger.

According to one embodiment of the invention, the fingerprint sensing device may further comprise plurality of charge amplifiers, one charge amplifier connected to each of said sensing structures, for providing a sensing signal indicative of a change of a charge carried by the sensing structure resulting from a change in a potential difference between the finger and the sensing structure.

According to one embodiment of the invention, the charge amplifier of the fingerprint sensing device may further comprise a negative input connected to the sensing structure; a positive input connected to a sensing element reference potential being substantially constant relative to the time-varying sensor ground potential; an output providing the sensing signal; a feedback capacitor connected between the negative input and the output; and at least one amplifier stage between the positive and negative inputs, and the output, wherein the charge amplifier is configured in such a way that a potential at the negative input substantially follows a potential at the positive input, such that the sensing element reference potential provides the change in potential difference between the finger and the sensing structure.

The charge amplifier converts charge at the negative input to a voltage at the output. The gain of the charge amplifier is determined by the capacitance of the feedback capacitor.

That the charge amplifier is configured in such a way that the potential at the negative input substantially follows the potential at the positive input should be understood to mean that a change in the potential at the positive input results in a substantially corresponding change in the potential at the negative input. Depending on the actual configuration of the charge amplifier, the potential at the negative input may be substantially the same as the potential at the positive input, or there may be a substantially constant potential difference between the positive input and the negative input. If, for instance, the charge amplifier is configured as a single stage amplifier, the potential difference may be the gate-source voltage of the transistor constituting the single stage amplifier.

It should be noted that the output of the charge amplifier need not be directly connected to the feedback capacitor, and that there may be additional circuitry between the output and the feedback capacitor. This circuitry could also be placed outside the matrix of sensing elements.

According to one embodiment of the invention, the fingerprint sensing system may further comprise a protective dielectric top plate covering the plurality of sensing elements; and an adhesive layer arranged between the plate and the sensing elements configured to attach the plate to the sensing elements. The protective dielectric top plate may advantageously be at least 20 µm thick and have a high dielectric strength to protect the underlying structures of the fingerprint sensing device from wear and tear as well as from ESD. Even more advantageously, the protective coating may be at least 50 µm thick. In various embodiments, the protective coating may be a few hundred µm thick.

According to one embodiment of the invention, the fingerprint sensing device may further comprise a bond wire connecting the connection pad to readout circuitry, wherein the bond wire extends into the adhesive above the sensing plane.

Both forwards and reverse wire bond. The adhesive allows for a larger tolerance in the bonding process, allowing the bond wire to protrude above the surface of the sensing plane. The protruding portion may for example be the wire loop or the end of the bond wire in the case of reverse bonding.

According to a second aspect of the invention, there is provided a method for forming a connection pad in a fingerprint sensing device, the method comprising the steps of: providing a first mask layer on the sensing device, the mask layer comprising an opening defining an area for the connection pad; forming a recess in the sensing device corresponding to the opening; removing the first mask layer; providing a conductive material in the recess and on a portion of the sensing device adjacent to the recess being elevated in relation to a floor of the recess, the conductive material in the recess forming a connection pad. An advantage of the aforementioned method is that by providing the conductive material both in the recess of the connection pad and on a portion of the sensing device adjacent to said recess in the same step, the lithography step of patterning the resist mask used does not have to take the difference in height into account. Instead, the focus plane of the lithography step can be the plane of the elevated portion adjacent to the recess. Thereby, metallization of the recessed portions of the connection pads can be performed simultaneously with a metallization step comprised in the process for making the fingerprint sensing device, which simplifies the manufacturing process. In addition to a more efficient manufacturing process, the above method also allows for the fabrication of smaller features in the focus plane, i.e. on the elevated portion of the device, compared to a process where the pattern also must be defined in a slope.

In one embodiment of the invention, the step of providing a conductive material may advantageously comprise depositing a conductive material; providing a second mask layer covering an area comprising the recess and the portion of the sensing device adjacent to the recess being elevated in relation to a floor of the recess; removing the conductive material on portions of the sensing device not covered by the second mask layer; and removing the second mask layer.

According to one embodiment of the invention, the portion of the sensing device adjacent to the recess being elevated in relation to a floor of the recess may advantageously correspond to a connection area for connecting the connection pad to the control circuitry such that an electrical connection is formed between the recessed portion and the connection area of the control circuitry through the deposition of the conductive layer.

In one embodiment of the invention, the step of providing a conductive material is advantageously the step in which a topmost metal layer of said sensing device is provided. However, the conductive material of the recesses may equally well be provided in a separate manufacturing step, for example by electroplating of copper.

Effects and features of this second aspect of the present invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail with reference to the appended drawings showing an example embodiment of the invention, wherein.

DETAILED DESCRIPTION OF PREFERRED EMBODIMENTS OF THE INVENTION

In the present detailed description, various embodiments of a fingerprint sensing device according to the present invention are mainly discussed with reference to a capacitive fingerprint sensing device. A method for manufacturing a connection pad for use in a fingerprint sensing device is also discussed. The manufacturing method may advantageously be used for the fabrication of connection pads also for other types of devices, such as for example an optical or RF-sensing device.

Figure 1:
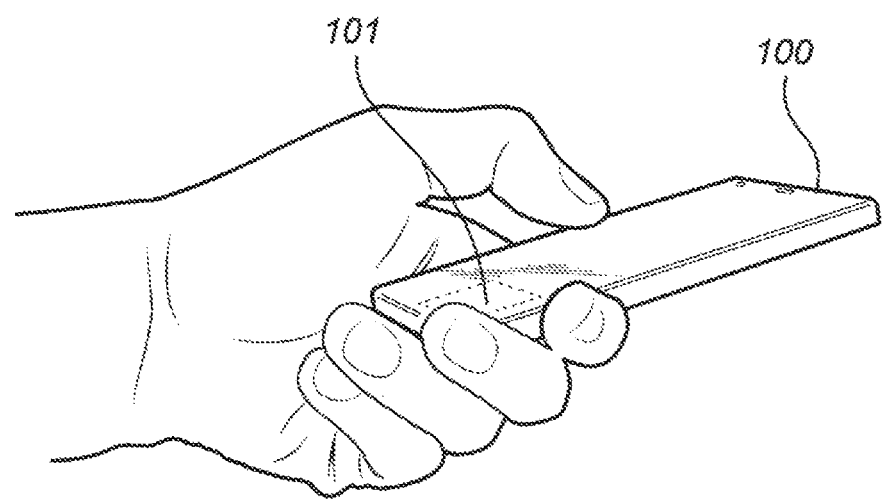
FIG. 1 schematically illustrates a consumer device comprising a fingerprint sensing device according to an embodiment of the invention.

FIG. 1 is a schematic illustration of a handheld device 100 comprising a fingerprint sensing device 101. A fingerprint sensing device 101 can be used in for example a mobile phone, a tablet computer, a portable computer or any other electronic device as a way to identify and/or authenticate a user.

Figure 2:
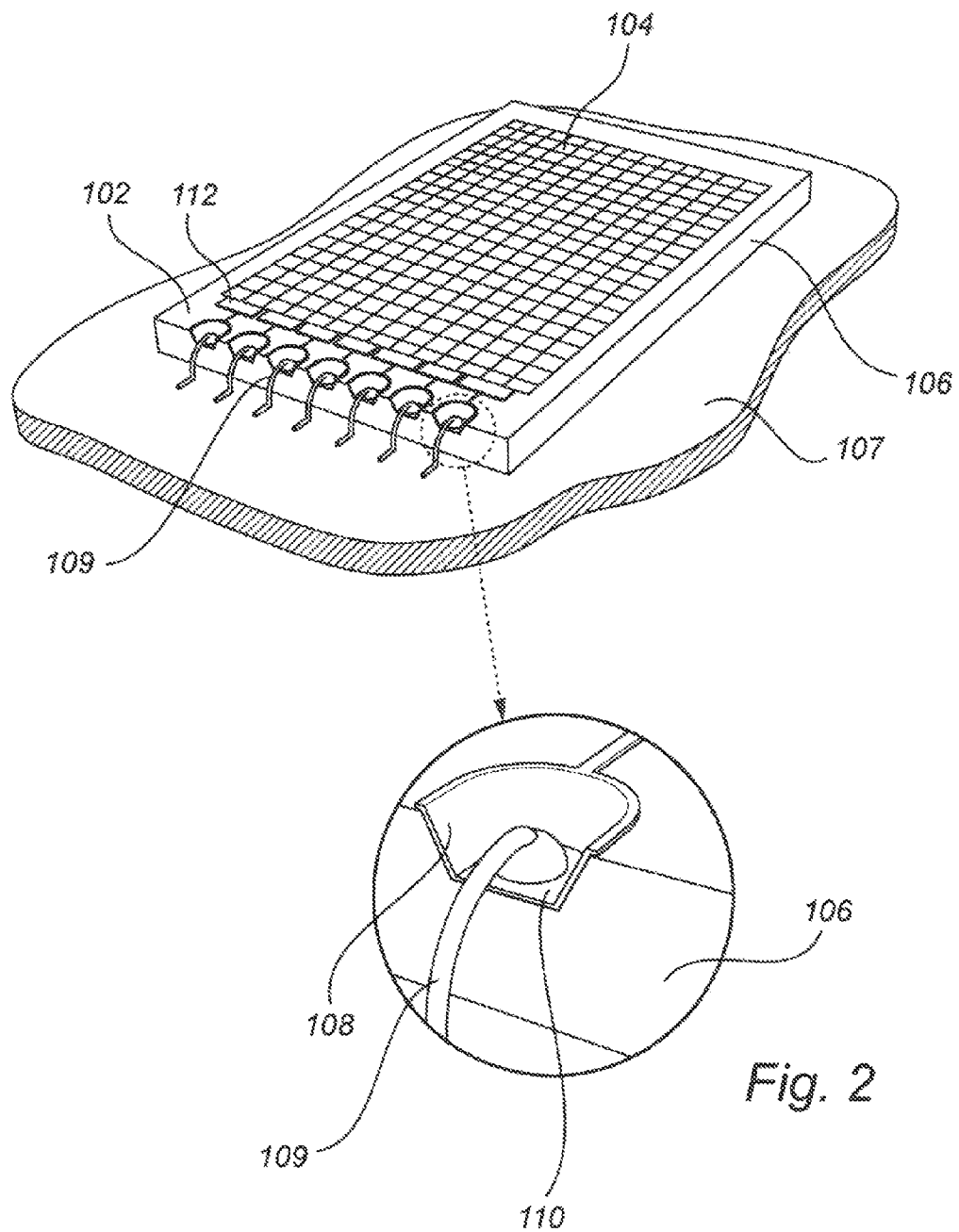
FIG. 2 schematically illustrates a fingerprint sensing device according to an embodiment of the invention.

FIG. 2 is a schematic illustration of a fingerprint sensing device 102 exposing a plurality of sensing elements 104 arranged in an array of sensing elements 104. Each sensing element 104 comprises a sensing structure, which can be seen as the top metal layer in the sensing element 104, a sensing element may also be referred to as a pixel. The fingerprint sensing device 102 also comprises sensing circuitry (not shown) configured to read a capacitive response from each of the sensing elements 104 when an object is located on a surface of the sensing device 102. The sensing circuitry may be arranged in the layers of the substrate beneath the sensing elements. The fingerprint sensing device 102 can for example be formed utilizing conventional CMOS technology. Such a fingerprint sensing device 102 is illustrated as arranged on a carrier 107, which may for example be a printed circuit board comprising readout circuitry for connecting the sensing device 102 to an auxiliary device. It is also shown that each of the connection pads 108 comprises a wire bond 109 to the carrier 107 for forming the electrical connection between the sensing device 102 and the carrier 107.

Furthermore, the cut-out of FIG. 2 illustrates a connection pad 108 which is separately recessed in relation to the adjacent portions of the substrate 106. The substrate 106 may for example be a conventional silicon substrate. Each connection pad has a floor 110 in a floor plane of the substrate 106, and an electrical connection between the connection pad 108 and sensing circuitry is provided by a conductive layer arranged on the floor 110 of the connection pad, reaching a connecting portion of the sensing circuitry via the sidewall of the recessed connection pad.

In the present context, for simplicity, the point of contact between the connection pads 108 and the sensing circuitry is schematically illustrated by a contacting element 112. In practice, the electrical connection between the connection pad 108 and the sensing circuitry must not be formed in the topmost metal layer as illustrated in FIG. 2. On the contrary, the connection between the connection pad 108 and the sensing circuitry may equally well be arranged in any of the metal layers used when fabricating the fingerprint sensing device 102, such as any of the metal layers in a conventional CMOS-process.

FIG. 3 is a cross section view of the connection pad 108 and part of the fingerprint sensing device 102 illustrated in FIG. 2. The depth of the recess, i.e. the difference in height between the floor 110 of the connection pad and the adjacent portions 118 being elevated in relation to the floor 110, is preferably in the range of 20 to 300 µm, more preferably 50 to 150 µm, and most preferably 90 to 110 µm. FIG. 3 further illustrates that the wire bond 109 does not protrude above the sensing elements 104 of the sensing device. It is also illustrated that the sensing elements 104 are covered by a dielectric layer 114 forming the surface 120 of the sensing device. The dielectric material from which the dielectric layer 114 is formed is suitably selected such that a good capacitive coupling can be formed between a finger placed on the surface of the sensing device and the underlying sensing elements 104. It may also be advantageous that the dielectric material is resistant to wear and tear. Accordingly, a fingerprint sensing device which has a planar surface can be provided.

Figure 3A:
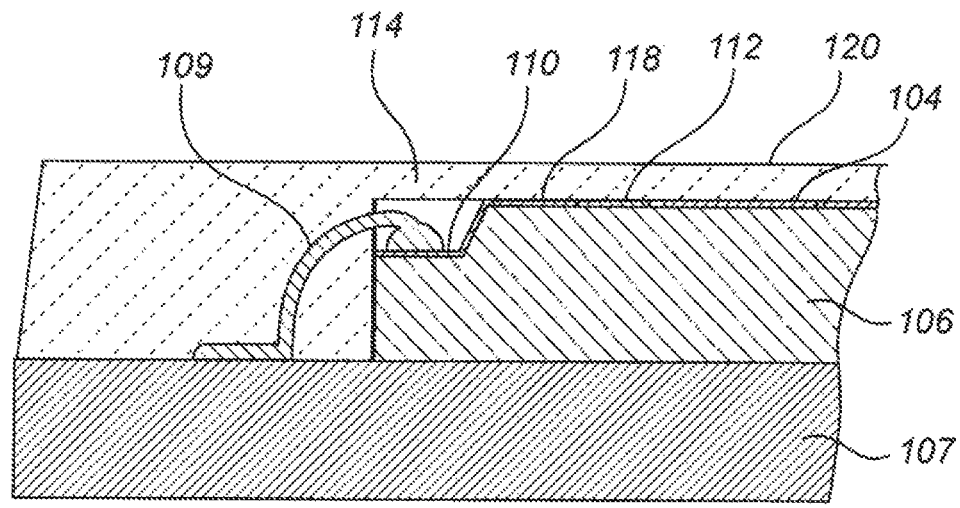
FIGS. 3a-b are cross-section views of the connection pad of a fingerprint sensing device according to embodiments of the invention.
Figure 3B:
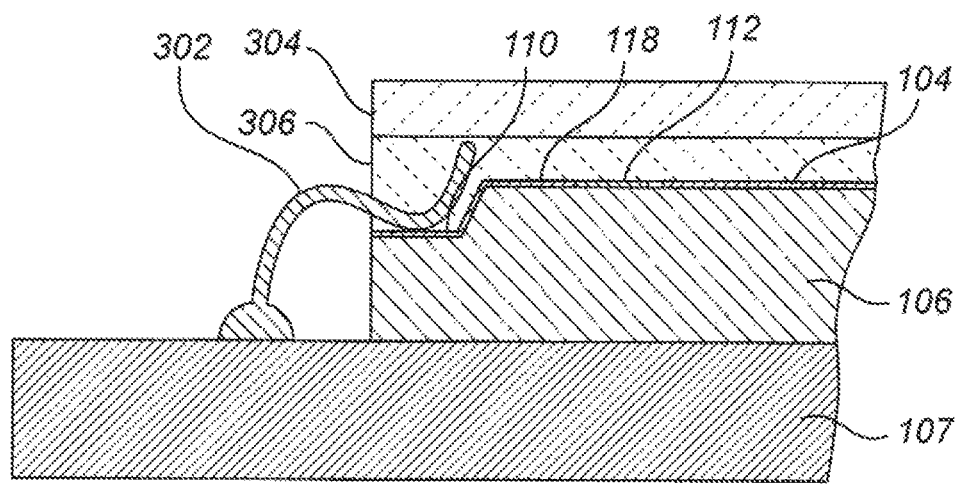

FIG. 3a illustrates a bond where the ball of the wire bond is located in the recess. However, a reverse bonding process may equally well be used as illustrated in FIG. 3b, where the ball of the bond 302 is located on the carrier 107 and the wire end of the bond is located in the recess and connected to the floor 110 of the connection pad. FIG. 3b further illustrates a protective layer which for example may be a plate from a material such as glass, ceramics, sapphire or the like. The protective layer is attached to the sensing elements 104 by means of an adhesive material 306 which may be flowable and/or compressible.

When using an adhesive which is flowable and/or compressible, it is not strictly required that the wire end of the bond wire is lower that the surface of the sensing element, it may instead protrude slightly above the surface which allows for the use of conventional fabrication methods for reverse wire bonding. Moreover, when using reverse bonding, the height of the bond may be more precisely controlled since it is determined by the end of the wire and not by the wire bond loop height. An additional advantage of using reverse bonding is that the bond loop in general is more easily depressible due to a larger curvature of the bond loop.

Thereby, a bond loop which would protrude above the sensing plane could more easily be depressed by structures covering the device, such as a covering protective plate.

An additional advantage of using a compressible adhesive in combination with individual recesses is that there is less volume to be filled by the adhesive compared to in a trench extending along the length of the chip. This makes it easier to completely fill the recess with the adhesive to avoid having undesirable voids in the device, thereby eliminating the need of a refill process to fill any remaining voids not filled by the adhesive.

Moreover, using recesses having an elevated portion between adjacent recesses provides additional mechanical support for the protective plate 304 at the edges of the chip.

Figure 4A:
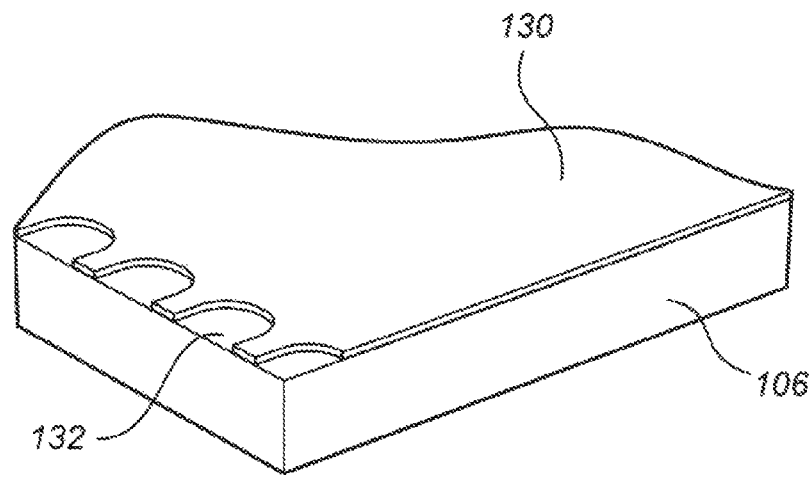
FIG. 4 schematically illustrates steps for forming a connection pad in a fingerprint sensing device according to an embodiment of the invention.
Figure 4B:
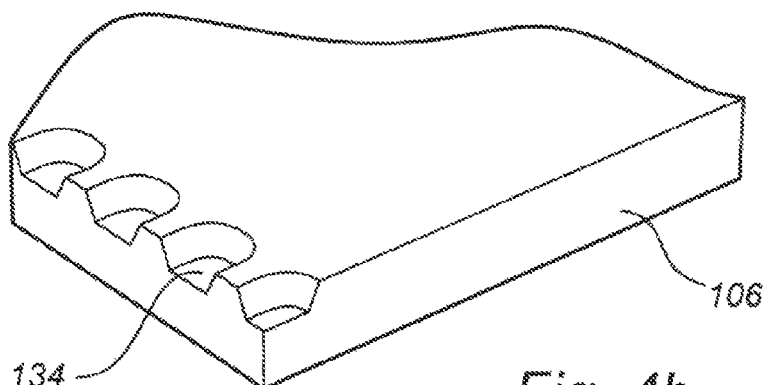
Figure 4C:
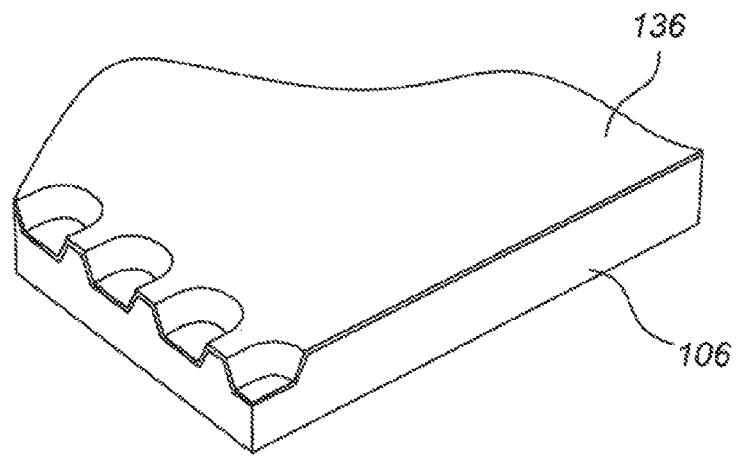
Figure 4D:
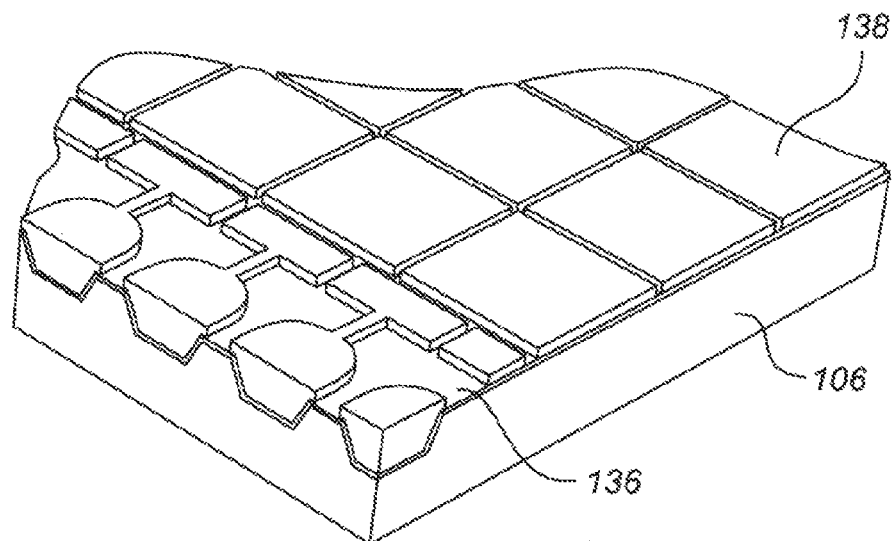
Figure 4E:
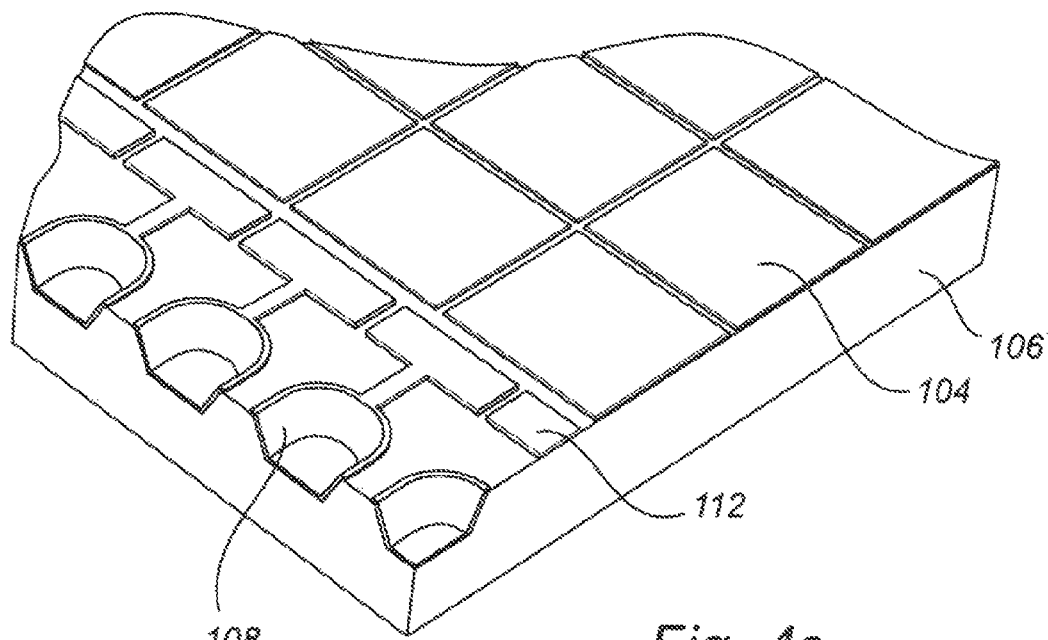
Figure 5:
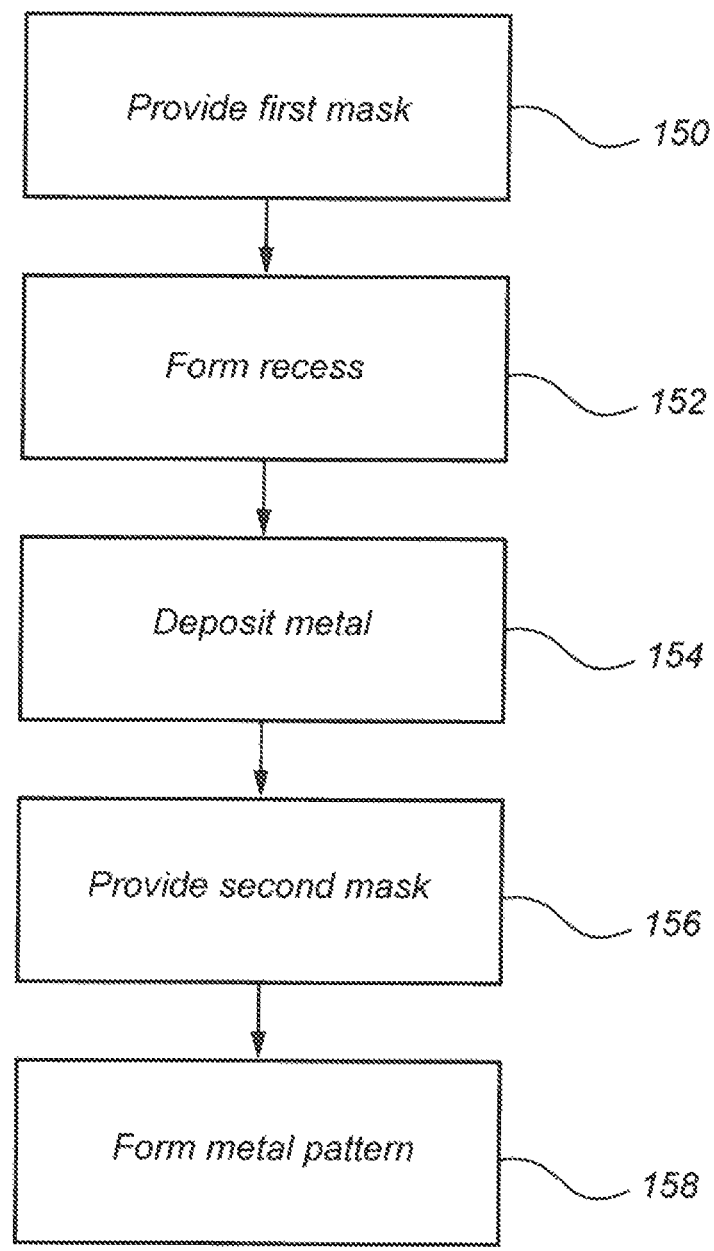
FIG. 5 is a flow-chart outlining the general step in a method for forming a connection pad in a fingerprint sensing device according to an embodiment of the invention.

FIGS. 4*a-e* schematically illustrate steps in a method for forming a connection pad 108 for a fingerprint sensing device 102 according to an embodiment of the invention, and FIG. 5 is a flow-chart outlining the general steps in such a method.

In step 150, illustrated by FIG. 4*a*, a resist mask 130 is formed on a substrate and openings 132 are formed in the resist mask 130 at the locations where recesses are to be formed. The substrate 106 is typically a conventional silicon substrate. However, other types of semiconducting or insulating substrates may equally well be used.

Next, in step 152, recesses 134 are formed in the substrate 106 as illustrated in FIG. 4*b*. The depth of the recesses 134 is approximately 100 μm. The recesses 134 may in principle be formed through any method for removing material known by the person skilled in the art, such as for example wet or dry etching. Depending on the method for removing material, different sidewall slopes of the recess 134 can be achieved. The depth of the recess is a tradeoff between the sacrificed surface area and wire bond loop height. Accordingly, a lower wire bond loop height means that a more shallow recess can be formed. A more shallow recess is particularly desirable for a recess having a sidewall where the angle is lower than 90°, in which case a deeper recess would take up more surface area of the chip for a given recess floor area.

After the recess 134 has been formed, a conductive layer 136 is deposited according to step 154 illustrated in FIG. 4*c*. In one embodiment of the invention, the conductive layer 136 is aluminum which is deposited by sputtering. In another embodiment, the conductive layer 136 may be copper deposited by electroplating. It is also possible to use other metals and deposition methods. Even though FIG. 4*c* illustrates that the conductive material 136 of the recess is deposited at the same time as the conductive material for making up the sensing elements, it is also possible to deposit the conductive material in the recesses in a separate manufacturing step. It may furthermore be desirable to use an insulation layer between a semiconductor substrate 106 and the conductive layer 136 to avoid the risk of short circuits via the substrate 106.

Next, in step 156 illustrated by FIG. 4*d*, a second resist mask 138 is formed to protect the portions of the conductive layer 136 which are to remain after the metal removal step 158.

After metal removal, the resist mask 138 is removed and the remaining conductive material can be seen in FIG. 4*e*. As illustrated in FIGS. 4*d* and 4*e*, the deposited metal layer 136 can be used to form both the connection pads 108 and the sensing elements 104 of the fingerprint sensing device in the same processing steps.

Figure 6:
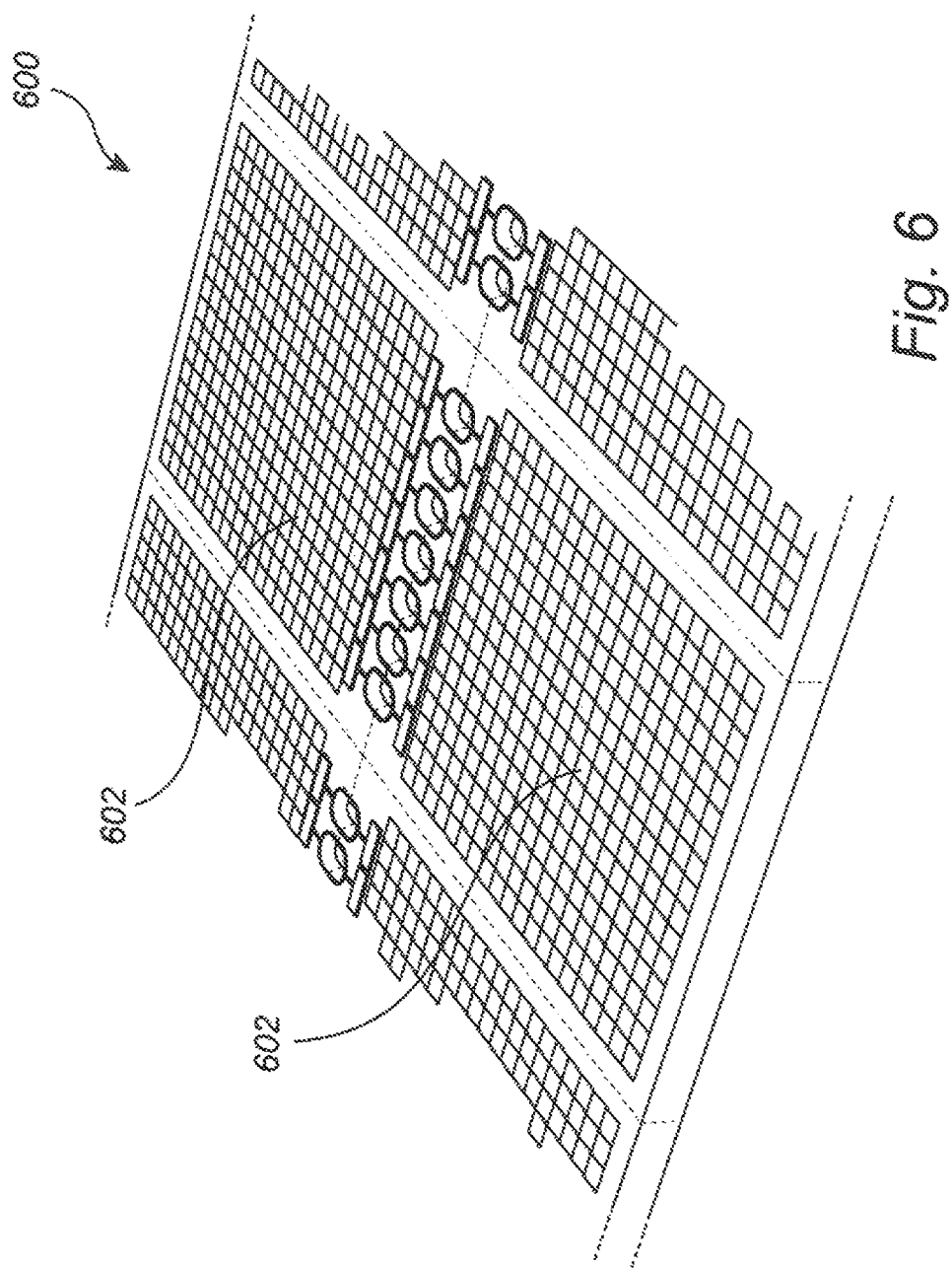
FIG. 6 schematically illustrates a plurality of sensing devices according to an embodiment of the invention.

FIG. 6 illustrates portion of a wafer 600 comprising a plurality of chips 602 for a sensing device arranged adjacent to each other as seen during manufacturing of a fingerprint sensing device 102. In fabrication, a large number of chips are simultaneously manufactured on a wafer. Thereby, the recesses are formed to have enclosing sidewalls so that they receive their final appearance only after the wafer has been separated into individual chips. To facilitate the cutting process, the mask and corresponding metal pattern may be arranged so that there is no metal in the path where the wafer 600 is to be cut into individual chips, the path corresponding to the dotted lines in FIG. 6, The inherent advantage of the approach as outlined in FIGS. 4*a-e* is that patterning by photolithographic processes inside any recessed areas relative to the original surface of the substrate, is not necessary. This allows for higher definition of features as only one surface plane has to be considered for optimal choice of focus depth during the lithographic process used when defining the metal layers. Furthermore, since no patterning in the z-direction (perpendicular to the surface plane) is needed, the recess structure also may enable the recess walls to be more close to a vertical. This will have a positive impact on the utilization grade of the wafer area. Moreover, the single focus plane allows for formation smaller features in the metal layer. Accordingly, a robust and cost effective process is provided where there is no need for post-processing of the device in order to form connection pads, and where a high surface utilization can be achieved.

An example configuration of the sensing elements 104 comprised in above-described embodiments of the fingerprint sensor 4 will now be described with reference to FIGS. 7*a-b*.

Figure 7A:
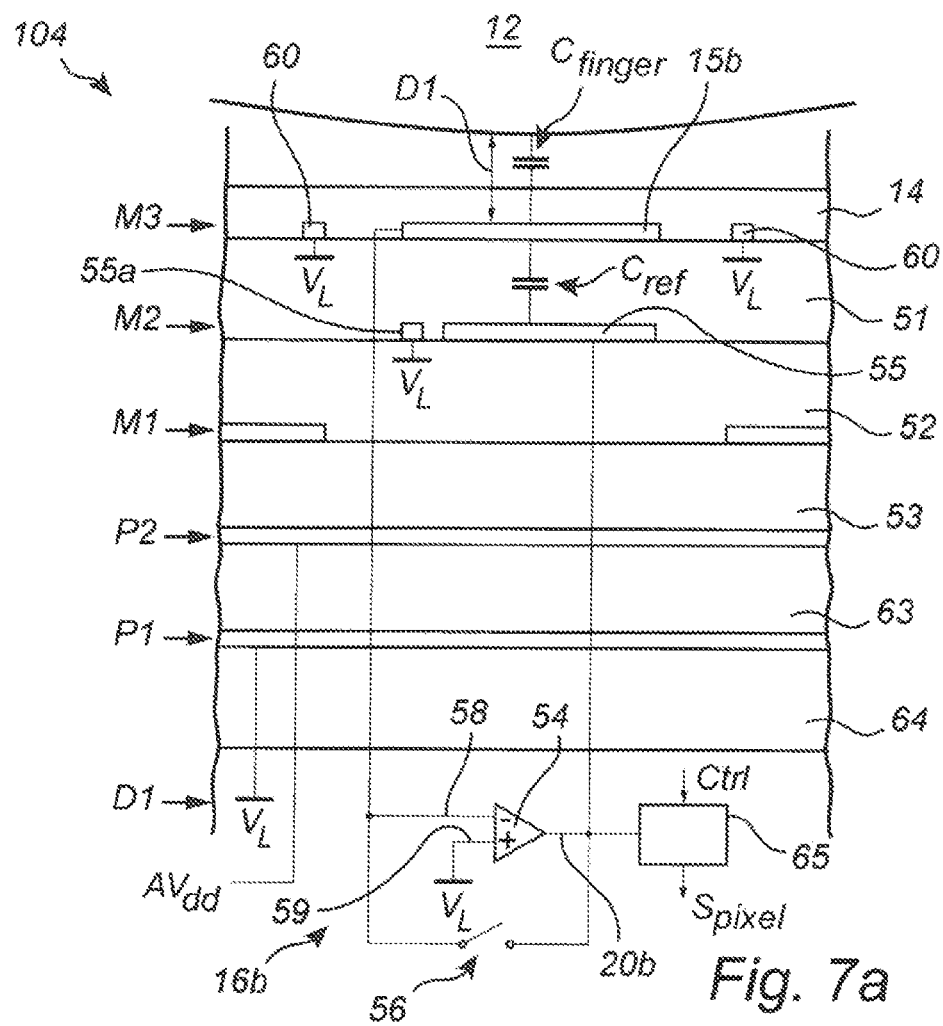
FIGS. 7a-b schematically illustrate example configurations of sensing elements comprised in embodiments of the fingerprint sensing system according to the present invention.

As can be seen in FIG. 7*a*, the sensing elements are formed in a layer structure comprising three conductive layers; a conductive layer M3 at the top, a conductive layer M2 in the middle and a lower conductive layer M1, with first 51, second 52, and third 53 layers of an insulating dielectric material under the respective conductive layers M3, M2, M1. Examples of materials for the conductive layers are typically copper, aluminum and doped polycrystalline silicone. Examples of materials for the insulating layers are typically SiO2, SiN, SiNOx and spin-on glass.

In addition, the layered structure used to form the sensing elements 104 may comprise a fourth layer P2 (second polysilicon) constituted by an electrically conducting layer which is kept at a certain analog voltage potential AVdd in relation to sensor ground $V_L$. Further, there is a fifth layer P1 (first polysilicon) that is also constituted by an electrically conducting layer which is kept at sensor ground potential $V_L$, working as an electric shielding. Under each one of these layers P2, P1 there are fourth 63 and fifth 64 layers of an insulating dielectric material. At the bottom, there is a semi conductive substrate layer D1 comprising active components such as the charge amplifiers 54. The conductive layers P2, P1 as well as the lower conductive layer M1 described above, may for example be used for routing of electrical connections, resistors and electrical shielding. One of the conductive layers P2, P1 may also be used to form the lower electrode 55 of each sensing element 104 instead of the second metal layer M2.

The sensing element 104 shown in FIG. 7*a* comprises a sensing structure 15*b* formed in the top conductive layer M3. The sensing structure 15*b* is connected to a sensing element circuit 16*b* comprising a charge amplifier 54, a lower electrode 55, a reset switch 56, and sample-and-hold circuitry 65.

As can be seen in FIG. 10*a*, the sensing structure 15*b* is connected to the negative input terminal 58 of the charge amplifier 54. The positive input terminal 59 of the charge amplifier 54 is connected to the sensor ground potential $V_L$. Hence, by means of the charge amplifier 54, the corresponding sensing structure 15b is virtually grounded (sensor ground), since the voltage over the input terminals 58, 59 of the charge amplifier 54 is almost zero. Depending on the circuit implementation of the charge amplifier there may be a small substantially constant voltage, such as the gate voltage of a CMOS transistor, between the negative 58 and positive 59 input terminals of the operational amplifier.

Figure 7B:
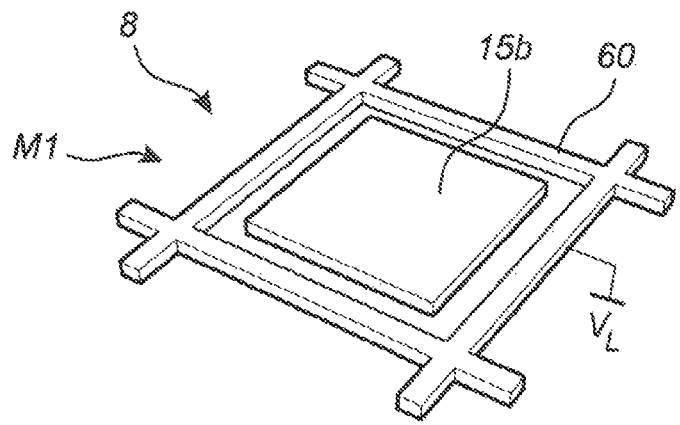

As can also be seen in FIG. 7b, each sensing structure 15b may be surrounded by a shield frame 60 formed in the top conductive layer M3, where the shield frame 60 is connected to the sensor ground potential $V_L$ as a conductive shielding to prevent lateral parasitic capacitances between adjacent sensing structures 15b, thus preventing or at least reducing so-called crosstalk between the sensing elements 104. The shield frame 60 may also be connected to another suitable potential.

Further, referring again to FIG. 7a, there is a protective dielectric layer 14 covering each of the sensing structures 15b, to protect the sensing elements 104 from ESD (Electrostatic Discharge) and external wear. A finger 12 that comes into the vicinity of the upper surface of the protective layer 14 gives rise to a capacitance $C_{finger}$ between the finger 12 and the sensing structure 15b.

As can be seen in FIG. 7a, the lower electrode 55 comprised in the sensing element circuit 16b is formed in the middle conductive layer M2. The lower electrode 55 is connected to an output terminal 20b of the charge amplifier 54. There is a feedback capacitance $C_{ref}$ formed between the sensing structure 15b and each lower electrode 55, which feedback capacitance $C_{ref}$ is connected between the negative input terminal 58 of the charge amplifier 54 and the output terminal 20b.

An auxiliary lower electrode 55a is also formed in the middle conductive layer M2, adjacent to the lower electrode 55. The auxiliary lower electrode 55a is connected to the sensor ground potential $V_L$ and used as an extra shielding, since the lower electrode 55 may typically have a smaller area than the sensing structure 15b.

The lower electrode 55 may be configured to achieve the desired gain for the sensor element circuit 16b. In particular, the size of the lower electrode 55 may be suitably selected, since the gain depends on the feedback capacitance $C_{ref}$, which in turn is dependent on the physical dimensions of the sensing structure 15b, the lower electrode 55, and the first insulating layer 51. The size of the auxiliary lower electrode 55a may be adjusted so as to fit beside the lower electrode 55.

As described above, swinging the sensor ground potential $V_L$ in relation to the potential of the finger 12 will result in a change in the voltage between each sensing structure 15b and the finger 12, which will in turn result in a change of the charge carried by the sensing structures 15b.

The change of charge that is carried by the sensing structure 15b is proportional to the capacitance $C_{finger}$ between the skin and the sensing structure 15b. As the sensing structure 15b is virtually grounded in relation to sensor ground $V_L$, its charge is transferred by the charge amplifier 54 to the lower electrode 55. We may then calculate the voltage output from the charge amplifier 54 as:

$$U_{out} = (C_{finger}/C_{ref}) U_{in}$$

The output voltage $U_{out}$ is sampled by the sample-and-hold circuitry 65, preferably using correlated double-sampling to remove the low frequency component of the common mode noise.

The sample-and-hold circuitry 65 is controlled by a control signal and outputs the pixel signal $S_{pixel}$ indicative of the capacitive coupling between sensing structure 15b and finger 12 to an analog-to-digital converter (not shown).

Even though the invention has been described with reference to specific exemplifying embodiments thereof, many different alterations, modifications and the like will become apparent for those skilled in the art.

Also, it should be noted that parts of the system may be omitted, interchanged or arranged in various ways, the sensing device yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A fingerprint sensing device comprising:
   sensing circuitry comprising a plurality of sensing elements, each sensing element comprising a sensing structure arranged in a sensing plane and facing a surface of the capacitive fingerprint sensing device, each of said sensing elements being configured to provide a signal indicative of an electromagnetic coupling between said sensing structure and a finger placed on said surface of the fingerprint sensing device; and
   a plurality of connection pads electrically connected to said sensing circuitry for providing an electrical connection between said sensing circuitry and readout circuitry,
   wherein each of said connection pads is separately recessed in relation to the sensing plane such that each connection pad has a floor in a floor plane, and wherein each connection pad is separated from an adjacent connection pad through a portion of said sensing device being elevated in relation to said floor plane.

2. The fingerprint sensing device according to claim 1, wherein each of said plurality of connection pads is arranged at an edge of said fingerprint sensing device such that each connection pad is defined by a recess having a floor reaching said edge of said sensing device.

3. The fingerprint sensing device according to claim 1, wherein said recess have at least one sidewall reaching from said floor to a connection plane of said fingerprint sensing device, and wherein a conductive layer is arranged on at least a portion of said floor and said sidewall such that an electrical connection is formed between said floor and said sensing circuitry via said connection plane.

4. The fingerprint sensing device according to claim 3, wherein said connection plane is arranged in the topmost metal layer of said fingerprint sensing device.

5. The fingerprint sensing device according to claim 3, wherein said connection plane is arranged in said sensing plane.

6. The fingerprint sensing device according to claim 3, wherein said sidewall is sloped from said floor to said connection plane.

7. The fingerprint sensing device according to claim 6, wherein said sloped sidewall has a slope higher than 45°, and preferably higher than 80°.

8. The fingerprint sensing device according to claim 3, wherein said conductive layer is further arranged on a portion of an essentially planar surface surrounding each of said recessed connection pads.

9. The fingerprint sensing device according to claim 1, wherein a depth of said recess is larger than 20 µm, more preferably larger than 50 µm, and most preferably larger than 100 µm.

10. The fingerprint sensing device according to claim 1, wherein said sensing device is arranged on a readout substrate comprising readout circuitry, and wherein at least one of said plurality of connection pads is wire bonded to said readout circuitry.

11. The fingerprint sensing device according to claim 1, wherein each of said sensing elements is configured to provide a signal indicative of a capacitive coupling between said sensing structure and a finger placed on said surface of the capacitive fingerprint sensing device.

12. The fingerprint sensing device according to claim 1, further comprising:
a plurality of charge amplifiers, one charge amplifier connected to each of said sensing structures, for providing a sensing signal indicative of a change of a charge carried by the sensing structure resulting from a change in a potential difference between the finger and the sensing structure.

13. The fingerprint sensing device according to claim 12, said charge amplifier comprising:
a negative input connected to said sensing structure;
a positive input connected to a sensing element reference potential being substantially constant relative to said time-varying sensor ground potential;
an output providing said sensing signal;
a feedback capacitor connected between said negative input and said output; and
at least one amplifier stage between said positive and negative inputs, and said output,
wherein said charge amplifier is configured in such a way that a potential at said negative input substantially follows a potential at said positive input, such that said sensing element reference potential provides said change in potential difference between said finger and said sensing structure.

14. The fingerprint sensing device according to claim 1, further comprising:
a protective dielectric top plate covering said plurality of sensing elements; and
an adhesive layer arranged between said plate and said sensing elements configured to attach said plate to said sensing elements.

15. The fingerprint sensing device according to claim 14, further comprising a bond wire connecting said connection pad to readout circuitry, wherein said bond wire extends above said sensing plane into said adhesive.

16. A method for forming a connection pad in a fingerprint sensing device, said method comprising the steps of:
providing a first mask layer on said sensing device, said mask layer comprising an opening defining an area for said connection pad;
forming a recess in said sensing device corresponding to said opening;
removing said first mask layer;
providing a conductive material in said recess and on a portion of said sensing device adjacent to said recess being elevated in relation to a floor of said recess, said conductive material in said recess forming a connection pad.

17. The method according to claim 16, wherein said step of providing a conductive material comprises:
depositing a conductive material;
providing a second mask layer covering an area comprising said recess and said portion of said sensing device adjacent to said recess being elevated in relation to a floor of said recess;
removing said conductive material on portions of said sensing device not covered by said second mask layer; and
removing said second mask layer.

18. The method according to claim 16, wherein said portion of said sensing device adjacent to said recess being elevated in relation to a floor of said recess correspond to a connection area for connecting said connection pad to said control circuitry such that an electrical connection is formed between said recessed portion and said connection area of said control circuitry through the deposition of said conductive layer.

19. The method according to claim 16, wherein the step of providing a conductive material is the step in which a topmost metal layer of said sensing device is provided.

20. The method according to claim 19, further comprising the steps of:
providing a dielectric plate having a compressible adhesive material attached to a first side thereof; and
attaching said dielectric plate to said topmost metal layer by means of pressing said adhesive material against said metal layer such that said compressible adhesive material fills said recess.

* * * * *

UNITED STATES PATENT AND TRADEMARK OFFICE
CERTIFICATE OF CORRECTION

PATENT NO. : 9,582,704 B2
APPLICATION NO. : 14/911573
DATED : February 28, 2017
INVENTOR(S) : Pontus Jägemalm et al.

It is certified that error appears in the above-identified patent and that said Letters Patent is hereby corrected as shown below:

On the Title Page

Page 2, item (56) References Cited
U.S. PATENT DOCUMENTS
Please insert --8,736,080 B2 5/2014 Arnold et al.--

Signed and Sealed this
Second Day of May, 2017

Michelle K. Lee
*Director of the United States Patent and Trademark Office*